(12) United States Patent
Maekawa et al.

(10) Patent No.: US 7,939,822 B2
(45) Date of Patent: May 10, 2011

(54) ACTIVE MATRIX DISPLAY DEVICE

(75) Inventors: Shinji Maekawa, Kanagawa (JP); Hideaki Kuwabara, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/346,250

(22) Filed: Dec. 30, 2008

(65) Prior Publication Data

US 2009/0152541 A1    Jun. 18, 2009

Related U.S. Application Data

(63) Continuation of application No. 12/327,876, filed on Dec. 4, 2008, and a continuation of application No. 11/332,351, filed on Jan. 17, 2006, now Pat. No. 7,858,451.

(30) Foreign Application Priority Data

Feb. 3, 2005    (JP) .................. 2005-027312

(51) Int. Cl.
*H01L 29/10*    (2006.01)
*H01L 21/339*    (2006.01)
*H01L 21/00*    (2006.01)
*H01L 21/44*    (2006.01)

(52) U.S. Cl. .................. 257/43; 257/72; 257/E29.292; 257/E27.06; 257/E21.02; 438/159; 438/161; 438/163; 438/401; 438/669

(58) Field of Classification Search .................. 257/43, 257/72, E29.292, E27.06, E21.017, E21.02, 257/E21.028; 438/159, 161, 163, 401, 669
See application file for complete search history.

(56) References Cited

U.S. PATENT DOCUMENTS

| | | | |
|---|---|---|---|
| 5,580,473 | A | 12/1996 | Shinohara et al. |
| 5,731,613 | A | 3/1998 | Yamazaki et al. |
| 6,294,274 | B1 | 9/2001 | Kawazoe et al. |
| 6,416,583 | B1 | 7/2002 | Kitano et al. |
| 6,532,045 | B2 | 3/2003 | Chung et al. |
| 6,627,263 | B2 | 9/2003 | Kitano et al. |
| 6,674,136 | B1 | 1/2004 | Ohtani |

(Continued)

FOREIGN PATENT DOCUMENTS

CN    1445821    10/2003

(Continued)

OTHER PUBLICATIONS

Kenji Nomura et al., "Thin Film Transistor Fabricated in Single-Crystalline Transparent Oxide Semiconductor", Science, May 23, 2003, vol. 300, pp. 1269-1272.

(Continued)

*Primary Examiner* — Bradley K Smith
*Assistant Examiner* — Jami M Valentine
(74) *Attorney, Agent, or Firm* — Nixon Peabody LLP; Jeffrey L. Costellia

(57) ABSTRACT

The present invention provides a manufacturing process using a droplet-discharging method that is suitable for manufacturing a large substrate in mass production. A photosensitive material solution of a conductive film is selectively discharged by a droplet-discharging method, selectively exposed to laser light, and developed or etched, thereby allowing only the region exposed to laser light to be left and realizing a source wiring and a drain wiring having a more microscopic pattern than the pattern itself formed by discharging. One feature of the source wiring and the drain wiring is that the source wiring and the drain wiring cross an island-like semiconductor layer and overlap it.

8 Claims, 10 Drawing Sheets

U.S. PATENT DOCUMENTS

| | | |
|---|---|---|
| 6,809,952 B2 | 10/2004 | Masui |
| 6,852,998 B2 | 2/2005 | Sung et al. |
| 7,009,204 B2 | 3/2006 | Tsai et al. |
| 7,049,190 B2 | 5/2006 | Takeda et al. |
| 7,061,014 B2 | 6/2006 | Hosono et al. |
| 7,105,868 B2 | 9/2006 | Nause et al. |
| 7,297,977 B2 | 11/2007 | Hoffman et al. |
| 7,323,356 B2 | 1/2008 | Hosono et al. |
| 7,371,625 B2 | 5/2008 | Yamazaki et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,468,304 B2 | 12/2008 | Kaji et al. |
| 2002/0012868 A1 | 1/2002 | Furuse et al. |
| 2002/0136829 A1 | 9/2002 | Kitano et al. |
| 2003/0032210 A1 | 2/2003 | Takayama et al. |
| 2005/0023579 A1 | 2/2005 | Yamazaki |
| 2005/0095356 A1 | 5/2005 | Nakamura et al. |
| 2005/0122351 A1 | 6/2005 | Yamazaki et al. |
| 2005/0146551 A1 | 7/2005 | Yamazaki et al. |
| 2005/0199878 A1* | 9/2005 | Arao et al. .......... 257/66 |
| 2005/0199959 A1 | 9/2005 | Chiang et al. |
| 2005/0275038 A1* | 12/2005 | Shih et al. .......... 257/382 |
| 2005/0276912 A1 | 12/2005 | Yamamoto et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0163743 A1 | 7/2006 | Kuwabara et al. |
| 2006/0170067 A1 | 8/2006 | Maekawa et al. |
| 2006/0208977 A1 | 9/2006 | Kimura |
| 2006/0231882 A1 | 10/2006 | Kim et al. |
| 2006/0238135 A1 | 10/2006 | Kimura |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0072439 A1 | 3/2007 | Akimoto et al. |
| 2007/0090365 A1 | 4/2007 | Hayashi et al. |
| 2007/0093002 A1 | 4/2007 | Maekawa et al. |
| 2007/0108446 A1 | 5/2007 | Akimoto |
| 2007/0158652 A1 | 7/2007 | Lee et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0012801 A1 | 1/2008 | Kimura et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0114910 A1 | 5/2009 | Chang |

FOREIGN PATENT DOCUMENTS

| | | |
|---|---|---|
| EP | 1 033 755 A2 | 9/2000 |
| JP | 60-170972 | 9/1985 |
| JP | 06-088972 | 3/1994 |
| JP | 2000-188251 | 7/2000 |
| JP | 2003-174153 | 6/2003 |
| JP | 2003-296681 | 10/2003 |
| KR | 2000-0076747 | 12/2000 |
| KR | 2001-0060808 | 7/2001 |
| WO | WO 2005/071478 A1 | 8/2005 |

OTHER PUBLICATIONS

Kenji Nomura et al., "Room-Temperature Fabrication of Transparent Flexible Thin-Film Transistors Using Amorphous Oxide Semiconductors", Nature, Nov. 25, 2004, vol. 432, pp. 488-492.

Satoshi Masuda et al., "Transparent Thin Film Transistors Using ZnO as an Active Channel Layer and their Electrical Properties", Journal of Applied Physics, Feb. 1, 2003, vol. 93 No. 3, pp. 1624-1630.

Korea Office Action (Application No. 2008-0122616) dated Aug. 14, 2009 with English Translation.

Korea Office Action (Application No. 2008-0122617) dated Aug. 14, 2009 with English Translation.

Office Action (U.S. Application No. 11/332,351) dated Sep. 4, 2009.

Korean Office Action (Application No. 2010-0018583;KR08516D3) dated Sep. 29, 2010.

* cited by examiner (CROSS SECTION OF A-B)

520: CONTACT HOLE (CROSS SECTION OF C-D)

ACTIVE MATRIX DISPLAY DEVICE

BACKGROUND OF THE INVENTION

1. Field of the Invention

The present invention relates to semiconductor devices having a circuit constituted by a thin film transistor (hereinafter, also referred to as a TFT), and a manufacturing method of the semiconductor devices. For example, the present invention relates to electronic devices mounting, a part thereof, an electro-optical device typified by a liquid crystal display panel or a light-emitting display device having an organic light-emitting element.

Note that a semiconductor device in this specification indicates a general device which can function with use of semiconductor characteristics, and the category of the semiconductor devices in this specification includes all types of devices such as electro-optical devices, semiconductor circuits and electronic devices.

2. Description of the Related Art

In recent years, a technique for forming a thin film transistor (TFT) using a thin semiconductor film (the thickness: about several to several hundred nm) formed over a substrate having an insulating surface has been attracted attentions. Thin film transistors have been widely used in electron devices such as ICs or electro-optical devices, and in particular, such thin film transistors have been developed actively as switching elements of image display devices.

The application range of active matrix type display devices which are typical image display devices, has become broad, and high definition, high aperture ratio or high reliability has been required more, with the increase in screen size.

In order to realize a high-performance semiconductor device which can operate at high speed, a structure with a low-electric-resistant wiring material will be more needed.

Reference 1 (Japanese Patent Application Laid-Open No. 2000-188251) describes a technique in which a film is formed over a semiconductor wafer using a device which can discharge a resist solution from a nozzle to have a thin linear shape.

SUMMARY OF THE INVENTION

In the present circumstances, a film formation method using spin coating is used in many manufacturing processes. When the substrate size is further increased in the future, the film formation method using spin coating has disadvantages in mass production, since a mechanism for rotating a large substrate becomes large or the loss of a material solution or waste of liquid becomes increased. In a case that a rectangular substrate is spun to be coated with a material solution; the coated film tends to be uneven, that is, the coated film tends to have a circular spot with its rotation axis as a center. The present invention provides a manufacturing process using a droplet-discharging method that is suitable for manufacturing a large substrate in mass production.

The present invention provides a large screen display using a source wiring (also referred to as a source electrode) or a drain wiring (also referred to as a drain electrode) which is formed by a droplet-discharging method, and a manufacturing method of the large screen display.

According to the present invention, a photosensitive material solution of a conductive film is selectively discharged by a droplet-discharging method, selectively exposed to laser light, and developed or etched, thereby allowing only the region exposed to laser light to be left and realizing a more microscopic pattern of a wiring than the pattern itself formed by discharging. Alternatively, a photosensitive material of a conductive film is selectively formed by a printing method such as a nano in print technique, selectively exposed to laser light, and developed or etched, thereby only allowing the region exposed to laser light to be left and realizing a more microscopic pattern of a wiring than the pattern itself formed by discharging.

According to the present invention, processes such as a light-exposure step or a development step can be shortened in a process for forming a conductive pattern (such as a source wiring or a drain wiring), the use amount of materials can also be reduced, and thus, costs can be largely reduced. Thus, the present invention can deal with large size substrates.

The material solution of a conductive film includes a metal such as Ag, Au, Cu, Ni, Al, Pt, W or Mo, or an alloy thereof, and a photosensitive resin including an organic polymer resin, a photo polymerization initiator, a photo polymerization monomer, a solvent, etc. As organic polymer resins, novolac resin, acrylic copolymer, methacrylic copolymer, cellulose derivatives, cyclic rubber resin, or the like can be used.

An additive agent such as a sensitizing agent, a sensitization auxiliary, a polymerization inhibitor, a plasticizer, a thickener, an oxidant inhibitor, a dispersion inhibitor, or a precipitation inhibitor may be added into the material solution of a conductive film as necessary.

A photosensitive material can be broadly divided into negative type and positive type. In a case of using the negative type photosensitive material, since an exposed portion brings about chemical reactions, and only the portion which is chemically reacted by a developer is left to become a pattern. In a case of using the positive type photosensitive material, an exposed portion brings about chemical reactions, and the portion which is chemically reacted by a developer is dissolved to leave only the unexposed portion, and then, a pattern is formed. In the present invention, a negative photosensitive material is included in a material solution of a conductive film. As negative photosensitive materials, a material including at least one type of a monomer, an oligomer, a polymer including one or more functional group such as an unsaturated group in molecules; a photosensitive compound such as an aromatic diazo compound, an aromatic azide compound, or an organic halide compound; a diazo resin; and the like are given.

Further, since the wiring width is determined based on the accuracy of laser irradiation, a desired wiring width can be obtained irrespective of an amount or viscosity of droplets to be dropped or a nozzle diameter. Generally, the wiring width is varied by a contact angle between a material solution discharged from a nozzle and a substrate. For example, the amount of droplets discharged from one nozzle having a diameter of 50 μm×50 μm of a typical ink jet device is 30 to 200 pl, and an obtained wiring width is 60 to 300 μm. A wiring having a narrow width (for example, an electrode width of 0.5 to 10 μm) can be obtained by conducting laser exposure according to the present invention. The amount of a material solution discharged from a nozzle having a thinner diameter than that of a typical nozzle is 0.1 to 40 pl, and an obtained wiring width is 5 to 100 μm.

In a case of forming a wiring pattern by a droplet-discharging method, a material solution of a conductive film may be discharged intermittently from a nozzle one droplet by one droplet in the form of a dot, or a material solution of a conductive film may be discharged continuously such that droplets attached in a linear form. In the present invention, a wiring pattern may be appropriately formed by discharging the material solution of a conductive film either in the form of a dot or in the linear form. In a case of forming a wiring pattern having a relatively wide width, it leads to better productivity that the wiring pattern is formed by continuously discharging a material solution from a nozzle such that the material solution is attached in a linear form.

Before forming a wiring pattern by a droplet-discharging method, a base layer for improving adhesion is preferably formed in advance over a whole surface or a selected area of a substrate. Alternatively, a pretreatment for base may be performed. As formation of the base layer, a treatment such that a photocatalyst material (titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$)) is dropped over the whole surface by a spraying method or a sputtering method, may be performed. Alternatively, a treatment such that an organic material (polyimide, acrylic, or a coated insulating film using a material which has a skeleton formed by the bond of silicon (Si) and oxygen (O), and which includes at least one of hydrogen, fluoride, an alkyl group, and aromatic hydrocarbon as a substituent) is selectively formed by an ink jet method or a sol-gel method, may be performed.

A photocatalyst substance refers to a substance having a photocatalyst function that yields photocatalyst activity by being irradiated with light in an ultraviolet region (wavelength of 400 nm or less, preferably, 380 nm or less). If a conductor mixed into a solvent is discharged by a droplet-discharging method as typified by an ink jet method onto a photocatalyst substance, a microscopic drawing can be realized.

Before emitting light to $TiO_x$, $TiO_x$ has a lipophilic property but no hydrophilic property, that is, the $TiO_x$ has water-shedding property. However, by light irradiation, $TiO_x$ brings about photocatalyst activity and has hydrophilic property but loses a lipophilic property. Further, $TiO_x$ is capable of having both of a lipophilic property and a hydrophilic property depending on the light irradiation time.

By doping a photocatalyst substance with a transition metal (Pd, Pt, Cr, Ni, V, Mn, Fe, Ce, Mo or W), a photocatalyst activity can be improved or a photocatalyst activity can be yielded with light in a visible light region (wavelength of 400 to 800 nm). Since light wavelength can be determined depending on a photocatalyst substance, light irradiation means to emit light having a wavelength that can yield a photocatalyst activity of a photocatalyst substance.

A hydrophilic property means a property of being easier to be wet by water. A super hydrophilic property refers to a state of having a contact angle of 30° C. or less, especially, 5° C. or less. On the other hand, a water-shedding property refers to a property of being difficult to be wet by water with a contact angle of 90° C. or more. Similarly, a lipophilic property refers to a property of being easier to be wet by oil, whereas an oil-shedding property refers to a property of being difficult to be wet by oil. Further, a contact angle means an angle formed by a surface and a tangent to a droplet at the edge of the dropped droplet.

In a case that a material solution of a conductive film has a flow property or the flow property is increased in baking, when forming a wiring using a material solution of a conductive film by a droplet-discharging method, there is a risk that it becomes difficult to form a microscopic pattern due to the drippings of droplets. In a case that a space between wirings is narrow, there is a risk that patterns are in contact with each other. According to the present invention, a microscopic pattern can be obtained by mixing a photosensitive material into the material solution of a conductive film, precisely exposing it laser light and developing it, even if a pattern becomes wide due to the drippings of droplets.

A structure of the present invention disclosed in this specification is a semiconductor device comprising: a gate electrode formed over a substrate having an insulating surface; a gate insulating film covering the gate electrode; a first island-like semiconductor layer including a channel formed over the gate insulating film; a second island-like semiconductor layer including an impurity element imparting an n-type or a p-type conductivity formed over the first island-like semiconductor layer; a drain wiring and a source wiring formed over the second island-like semiconductor layer, wherein the source wiring crosses and overlaps the first island-like semiconductor layer and wherein the first island-like semiconductor layer overlapped with a region between the source wiring and the drain wiring is a channel.

Another structure of the present invention is, as shown in FIG. 2B, a semiconductor device comprising: a gate electrode formed over a substrate having an insulating surface; a gate insulating film covering the gate electrode; a first island-like semiconductor layer including a channel formed over the gate insulating film; a second island-like semiconductor layer including an impurity element imparting an n-type or a p-type conductivity formed over the first island-like semiconductor layer; a drain wiring and a source wiring formed over the second island-like semiconductor layer, wherein the length L between one end and the other end of the first island-like semiconductor film is a sum of a channel length L1, a length of a region overlapping the drain wiring, a length L2 between the region overlapping the drain wiring and one end of the semiconductor film, a length of a region overlapping the source wiring, and a length L3 between the region overlapping the source wiring and the other end of the semiconductor film.

In each of the above structures, the length of the region in which the source wiring overlaps the first semiconductor layer with the second semiconductor layer therebetween is equal to a width of the source wiring. Further, the length of the region where the source wiring overlaps the first semiconductor layer is equal to a width of the source wiring, since the width of the source wiring is determined by laser scanning and laser light is scanned in such a way that it crosses the first semiconductor layer.

In each of the above structures, the length of the region where the drain wiring overlaps the first semiconductor layer is equal to a width of the drain wiring.

In a pattern forming method of a conductive layer or the like with the use of a droplet-discharging method, a pattern is formed as follows. A pattern forming material which is processed into particulates, is discharged, and welded or fused to be joined by baking to cure the pattern forming material. Accordingly, although a pattern which is formed by a sputtering method or the like often shows a columnar structure, the pattern formed by the above method often shows a polycrystalline state having a lot of grain boundaries.

One feature of the present invention is that a conductive layer (a source wiring or a drain wiring) formed by a droplet-discharging method is a material containing resin. This resin is a material serving as a binder or the like included in droplets including a conductive material, and this resin, a solvent and metal nano particles are mixed, so that discharging droplets by an ink-jet method becomes possible.

In the above structure, an insulating film covering the first semiconductor layer, and the drain and source wirings is provided. The first semiconductor layer can be protected by this insulating film.

In each of the above structures, the drain wiring has a meandering portion, and the contact with the upper electrode is made in the meandering portion. Since the drain wiring is formed by scanning laser light, one-stroke pattern is preferable, and the conductive pattern in a portion in which a contact hole is formed, is selectively made meandering. In addition, just after forming the contact hole, the serpentine conductive film pattern and the surface of the insulating film which is not overlapped with the conductive film are exposed. By making the conductive pattern meandering (zigzag) in the contact portion, concavities and convexities are formed, and the adhesion with the upper electrode to be formed thereon can be enhanced.

A structure of the present invention for realizing the above-described structures is a manufacturing method of a semiconductor device, comprising the steps of: forming a gate electrode over a substrate having an insulating surface; forming a gate insulating film covering the gate electrode; forming a first semiconductor layer over the gate insulating film, and forming a second semiconductor layer including an impurity element imparting an n-type or a p-type conductivity formed over the first semiconductor layer; forming a first pattern over the second island-like semiconductor layer by a droplet-discharging method or a printing method; irradiating a region having a width smaller than the first pattern with laser light, removing a region of the first pattern which is not irradiated with the laser light to form a drain wiring and a source wiring; etching a part of a surface of the semiconductor layer using the drain wiring and the source wiring as masks so as to separate a channel formed from the first semiconductor layer, and to separate the second semiconductor layer into two portions to sandwich the channel.

In the structure regarding the manufacturing method, the laser irradiation is conducted such that the laser light crosses the first semiconductor layer.

The present invention can be applied to channel-etch type TFTs, and channel-stop type TFTs (inversely staggered TFTs). In addition, the present invention may be applied to multigate TFTs having plural channel forming regions, e.g., double gate TFTs, without being limited to single gate type TFTs.

In this specification, a semiconductor film mainly containing silicon, a semiconductor film mainly containing an organic material, or a semiconductor film mainly containing a metal oxide can be used, as a semiconductor layer serving as an active layer of a TFT. As the semiconductor film mainly containing silicon, an amorphous semiconductor film, a semiconductor film having a crystalline structure, a compound semiconductor film having an amorphous structure and the like can be used, specifically, amorphous silicon, micro-crystalline silicon, polycrystalline silicon or the like can be used. As the semiconductor film mainly containing an organic resin, a semiconductor film mainly containing a substance which includes a constant amount of carbon or allotropes of carbon (excluding diamond), and another element, can be used. Specifically, pentacene, tetracene, a thiophen oligomer derivative, a phenylene derivative, a phthalocyanine compound, a polyacetylene derivative, a polythiophene derivative, a cyanine dye, etc., are given. Further, as the semiconductor film mainly containing a metal oxide, zinc oxide (ZnO); an oxide of zinc, gallium and indium (In—Ga—Zn—O); or the like, can be used.

By the present invention, miniaturization of bottom gate type TFTs can be achieved by using a wiring formed by a droplet-discharging method. Specifically, the interval between a source wiring and a drain wiring which are formed using laser light can be adjusted based on the conditions of laser light (such as a scanning method or a spot size). Thus, the channel length can be made microscopic.

The source wiring and the drain wiring electrically connect with the semiconductor layer by crossing them over the semiconductor layer, and the pattern size of the semiconductor layer can be reduced.

DETAILED DESCRIPTION OF THE INVENTION

Figure 1A:
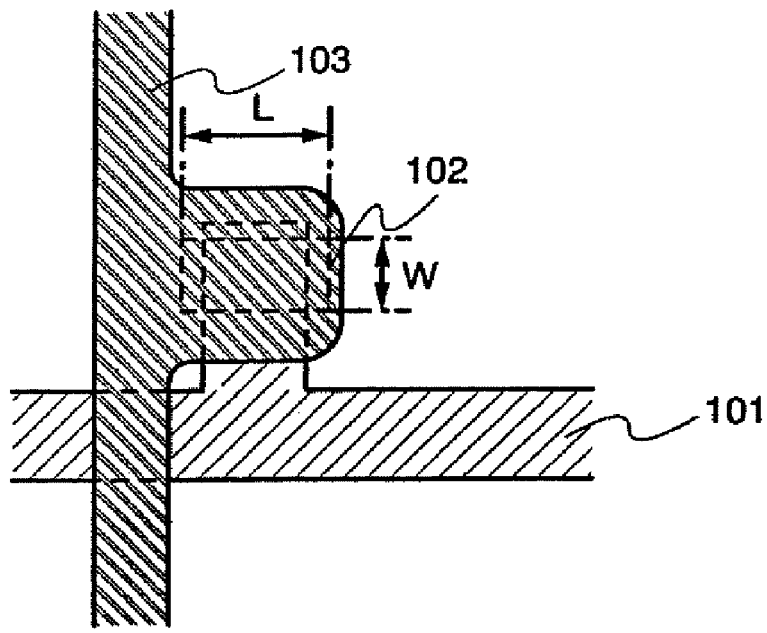
FIGS. 1A and 1B each show a top view showing one aspect of the present invention (Embodiment Mode 1)

The embodiment modes of the present invention are described hereinafter.

Embodiment Mode 1

Here, a manufacturing example of an active matrix type display device using a channel-etch type TFT as a switching element, is shown in FIGS. 1A, 1B, 2A and 2B.

A base insulating film 110 is formed over a substrate 110 having an insulating surface. A base film made of an insulating film such as silicon oxide, silicon nitride, silicon oxynitride, or silicon nitride oxide is formed as the base insulating film 110. If it is not necessary, there is no particular need to form the base insulating film.

In addition to a non-alkaline glass substrate such as barium borosilicate glass, alumino borosilicate glass, or aluminosilicate glass manufactured by a fusion method or a floating method, a plastic substrate having a heat resistance that can withstand a processing temperature in this manufacturing process, or the like can be used for the substrate 100.

Thereafter, a conductive film having a thickness of 100 to 600 nm is formed by a sputtering method over the base insulating film 110. The conductive film may be formed with a single layer of an element selected from Ta, W, Ti, Mo, Al or Cu, or an alloy material or a compound material mainly containing such an element, or a stacked layer thereof. In addition, a semiconductor film typified by a polycrystalline silicon film doped with an impurity element such as phosphorus may be used.

Subsequently, a resist mask is formed with a photomask, and etching is conducted by a dry etching method or a wet etching method. In the etching step, the conductive film is etched to form a gate electrode 101.

Thereafter, a gate insulating film 111, a semiconductor film, and an n-type semiconductor film are sequentially formed by a plasma CVD method or a sputtering method.

As the gate insulating film 111, a material mainly containing silicon oxide, silicon nitride, silicon nitride oxide or silicon oxynitride which is formed by a PCVD method, is used. In addition, a siloxane based polymer is discharged by a droplet-discharging method and baked to form a $SiO_x$ film containing an alkyl group as the gate insulating film 111.

The semiconductor film is formed with an amorphous semiconductor film or a semi-amorphous semiconductor film which is manufactured with a vapor phase growth method, a sputtering method or a thermal CVD method using a semiconductor material gas typified by silane or germanium.

An n-type semiconductor film may be formed by a PCVD method using a silane gas and a phosphine gas, which can be formed with an amorphous semiconductor film or a semi-amorphous semiconductor film. A contact resistance of the semiconductor film and an electrode (an electrode to be formed in a later step) is decreased when an n-type semiconductor film is provided, which is preferable. However, the n-type semiconductor film may be formed if necessary. In addition, a p-type semiconductor film may be used instead of the n-type semiconductor film. A semiconductor film including an impurity element imparting p-type conductivity to a semiconductor, such as boron, may be used as the p-type semiconductor film.

Thereafter, a mask is provided, and a semiconductor film and an n-type semiconductor film are etched selectively to obtain an island-like semiconductor film and an n-type semiconductor film 106. The manufacturing method of the mask may be a droplet-discharging method or a printing method (relief printing, flat plate, copperplate printing, screening printing or the like). Although a desired mask pattern may be formed directly by a droplet-discharging method or a printing method, it is desirable that a rough mask pattern is formed by a droplet-discharging method or a printing method, and then, a fine resist pattern may be formed by conducting a selective light exposure, in order to form a mask pattern in high definition.

Thereafter, a composition which includes a photosensitive material and a conductive material such as silver (Ag), gold (Au), copper (Cu), tungsten (W), or aluminum (Al) is selectively discharged by a droplet-discharging method to form a conductive film pattern 103. The conductive film pattern 103 is formed to cover the semiconductor film and the n-type semiconductor film.

A top view at this time is shown in FIG. 1A. A region surrounded by a dotted line shows an outline 102 of a pattern shape of the semiconductor film, and has a rectangular shape with the length L and the width W. It should be noted that the present invention is not limited to the rectangular shape, and an oval shape, an L-like shape, or an irregular shape may be employed, although this embodiment mode describes the case of the rectangular shape.

Thereafter, a selective laser irradiation is conducted to expose a part of the conductive film pattern. Here, laser scanning is conducted so that laser light crosses the semiconductor film having the rectangular shape. Two crossing portions are formed on the semiconductor film by the laser scanning. Since a photosensitive material is pre-included in the material solution of a conductive film to be discharged, a chemical reaction occurs due to laser irradiation. Here, an example of using a negative type photosensitive material as the photosensitive material is shown, which allows the portion which is chemically reacted by laser light to be left. An accurate pattern shape, in particular, a wiring with a thin width can be obtained by laser irradiation.

Figure 3:
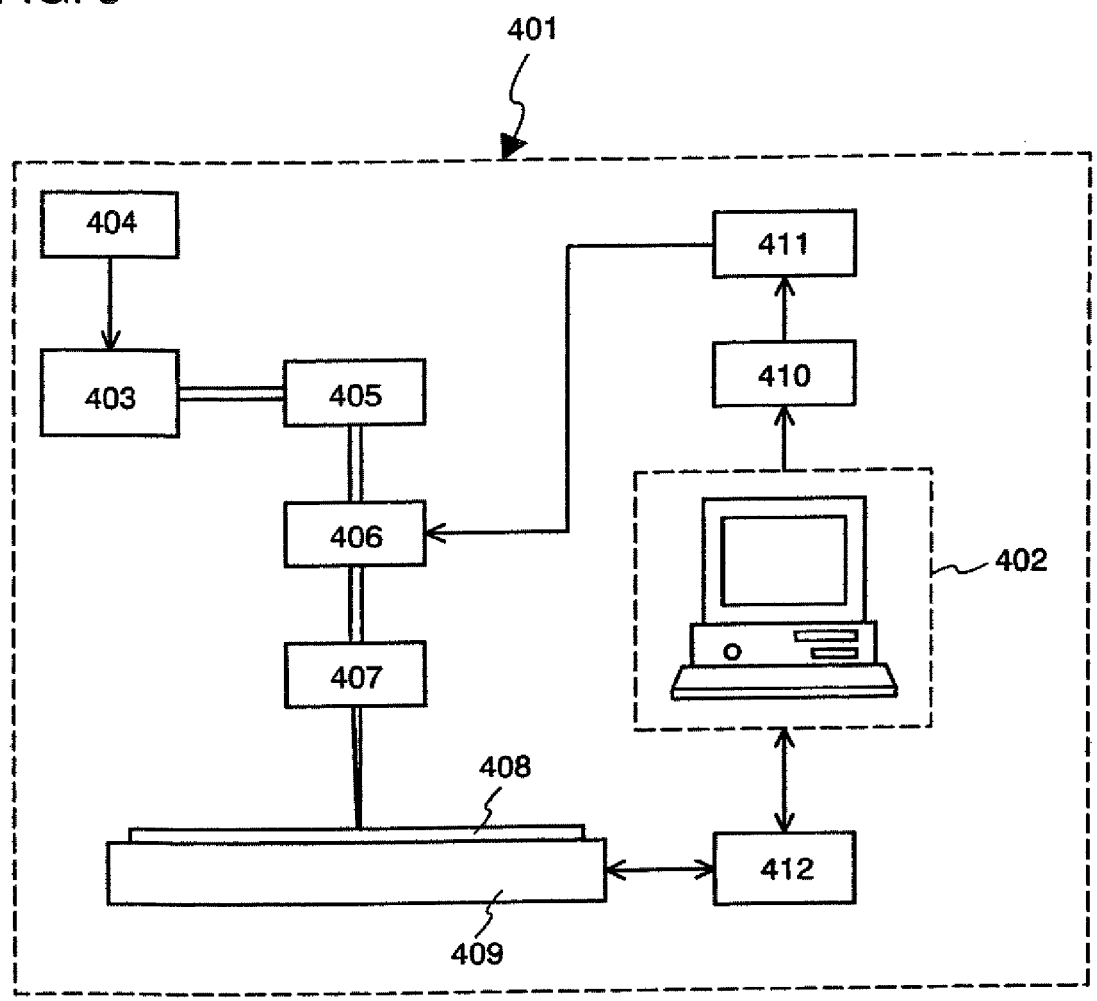
FIG. 3 shows a laser beam drawing apparatus (Embodiment Mode 1)

Herein, a laser beam drawing apparatus is described with reference to FIG. 3. A laser beam drawing apparatus 401 includes: a personal computer (hereinafter referred to as a PC) 402 for conducting various types of control in laser irradiation; a laser oscillator 403 for outputting a laser beam; a power source 404 of the laser oscillator 403; an optical system (ND filter) 405 for attenuating the laser beam; an acousto-optic modulator (AOM) 406 for modulating intensity of the laser beam; an optical system 407 having a lens for enlarging or reducing a cross section of the laser beam, a mirror for changing a light path, and the like; a substrate movement mechanism 409 having an X stage and a Y stage; a D/A converter 410 for converting control data outputted from the PC into digital-analog; a driver 411 for controlling the acousto-optic modulator (AOM) 406 in accordance with an analog voltage outputted from the D/A converter; and a driver 412 for outputting a driving signal for driving the substrate movement mechanism 409.

A laser oscillator that can oscillate ultraviolet light, visible light, or infrared light can be used as the laser oscillator 403. An excimer laser oscillator of KrF, ArF, XeCl, Xe, or the like, a gas laser oscillator of He, He—Cd, Ar, He—Ne, HF, or the like, a solid-state laser oscillator using a crystal such as YAG, $GdVO_4$, $YVO_4$, YLF, or $YAlO_3$ doped with Cr, Nd, Er, Ho, Ce, Co, Ti, or Tm, a semiconductor laser oscillator of GaN, GaAs, GaAlAs, InGaAsP, or the like can be used as the laser oscillator Note that it is preferable to apply any of first to fifth harmonics of a fundamental wave to the solid-state laser oscillator.

A plurality of laser oscillators may be used to shorten irradiation time, and laser irradiation may be conducted to plural portions of one substrate to be baked.

Subsequently, a method for exposing a photosensitive material to light with the use of the laser beam drawing apparatus is described. The photosensitive material here indicates a material of a conductive film (including a photosensitive material) which becomes a conductive film pattern.

When a substrate 408 is set on the substrate movement mechanism 409, the PC 402 detects a position of a marker marked on the substrate with a camera which is not shown in the diagram. Next, the PC 402 generates movement data for moving the substrate movement mechanism 409, based on position data of the detected marker and preliminarily inputted drawing pattern data. Thereafter, the PC 402 controls the amount of output light from the acousto-optic modulator (AOM) 406 through the driver 411. Accordingly, after a laser beam outputted from the laser oscillator 403 is attenuated by the optical system 405, the amount of light is controlled by the acousto-optic modulator (AOM) 406 to be a predetermined amount. On the other hand, a light path and a beam shape of the laser beam outputted from the acousto-optic modulator (AOM) 406 are changed by the optical system 407 and the laser beam is collected by a lens. Thereafter, a photosensitive material formed over the substrate is irradiated with the beam to be exposed to light. At this time, the movement of the substrate movement mechanism 409 in an X direction and a Y direction is controlled in accordance with the movement data generated by the PC 402. Consequently, a predetermined portion is irradiated with the laser beam, and light exposure of the photosensitive material is performed.

A part of the energy of the laser light emitted to the photosensitive material is converted into heat so that a part of the photosensitive material is reacted. Therefore, a width of a pattern becomes slightly larger than that of the laser beam. Further, since laser light having a short wavelength can be easily collected to have a smaller beam diameter, a laser beam having a short wavelength is preferably emitted to form a pattern having a microscopic width.

The form of a laser beam spot on a surface of the photosensitive material is processed into a point-like shape, a round shape, an oval shape, a rectangular shape, or a linear form (in a strict sense, an elongated oblong shape) by an optical system. The form of a laser beam spot may be round. However, the form of the laser beam spot is preferably linear, since a pattern having a uniform width can be formed with the linear laser spot.

Here, a laser beam is selectively emitted while moving the substrate. However, the present invention is not limited thereto. A laser beam can be emitted by scanning the laser beam into X or Y axis direction. In this instance, a polygon mirror or a galvanometer mirror is preferably used as the optical system 407.

Then, development is performed by using etchant (or developer) to remove excess portions, and main-baked to form a metal wiring serving as a source wiring 104 or a drain wiring 105.

Alternatively, exposure by laser irradiation may be performed, after a material solution of a conductive film is dropped, and dried indoors or pre-baked.

When the energy per area of laser light for the light-exposure is made larger, it is possible that main baking becomes unnecessary. The manufacturing process can be shortened by reducing the step of main baking. As a developer, an organic solvent, an alkali water solution or the like can be used. For example, when an alkali water solution is used for the development, a polymer which is soluble in alkali (such as methyl acrylate, ethyl acrylate, or isopropyl acrylate) is preferably contained as a composition for forming the conductive film pattern 103.

Figure 1B:
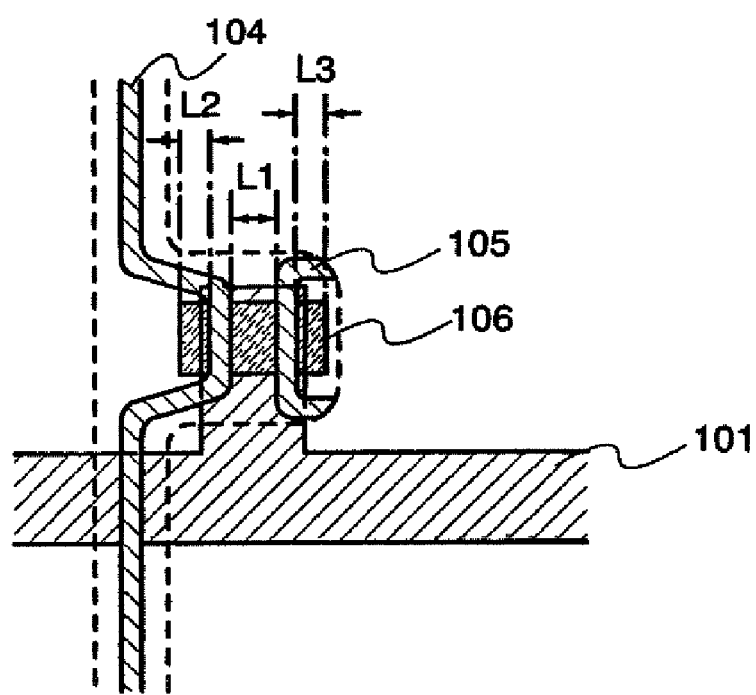

A top view at this time is shown in FIG. 1B. As shown in FIG. 1B, an n-type semiconductor film 106 which is not overlapped with the source wiring 104 or the drain wiring 105, is exposed. In addition, at this stage, the semiconductor film and the n-type semiconductor film have the same pattern.

The length L between one end and the other end of the semiconductor film is a sum of L1, the length of a region overlapping the drain wiring, the length L2 between the region overlapping the drain wiring and one end of the semiconductor film, the length of a region overlapping the source wiring, and the length L3 between the region overlapping the source wiring and the other end of the semiconductor film. It should be noted that the interval L1 between the source wiring 104 and the drain wiring 105 is equal to the length of a channel forming region to be formed.

Then, a part of the n-type semiconductor film and an upper portion of the semiconductor film are etched using the source wiring 104 and the drain wiring 105 as masks. A hydrogen treatment is conducted if necessary. At this time, a channel-etch type TFT having a channel forming region 107 which becomes an active layer, a source region 108 for making an ohmic contact with the source wiring 104, and a drain region 109 for making an ohmic contact with the drain wiring 105, is completed. An insulating film protecting the channel forming region 107 may be formed. By using an insulating film such as silicon nitride or silicon oxynitride as the insulating film for protection, the channel forming region 107 can be protected from contamination due to impurities, and thus, the reliability of a TFT can be increased.

Thereafter, an electrode 112 is formed to be overlapped with the drain wiring 105. The electrode 112 is obtained by forming a predetermined pattern made from a composite containing indium tin oxide (ITO), indium tin oxide containing silicon oxide (ITSO), zinc oxide (ZnO), tin oxide ($SnO_2$), or the like by a droplet-discharging method or a printing method, and baking it.

In a case where ITO is formed by a droplet-discharging method or a printing method, a precursor of a transparent conductive film may be used, for example, a liquid material is used, in which organic indium and organic tin of 8% are mixed in xylol in such a way that the rate of the organic indium and the organic tin is 97:3.

In a case of forming a liquid crystal display device, the electrode 112 is referred to as a pixel electrode. Further, in a case of forming a reflective liquid crystal display device, a metal film pattern having reflectivity such as silver (Ag) or aluminum (Al) is formed for the electrode 112.

In a case of forming a light-emitting display device, the electrode 112 is used as the first electrode; a partition (also referred to as a bank) covering an edge of the electrode 112 is formed; a layer functioning as an electroluminescent layer, i.e., a layer including an organic compound is formed, and a second electrode is formed last. Note that it is necessary that materials of the first electrode and the second electrode are selected in consideration of the work function, and the first electrode and the second electrode each can serve as an anode or a cathode according to the pixel structure.

Figure 2A:
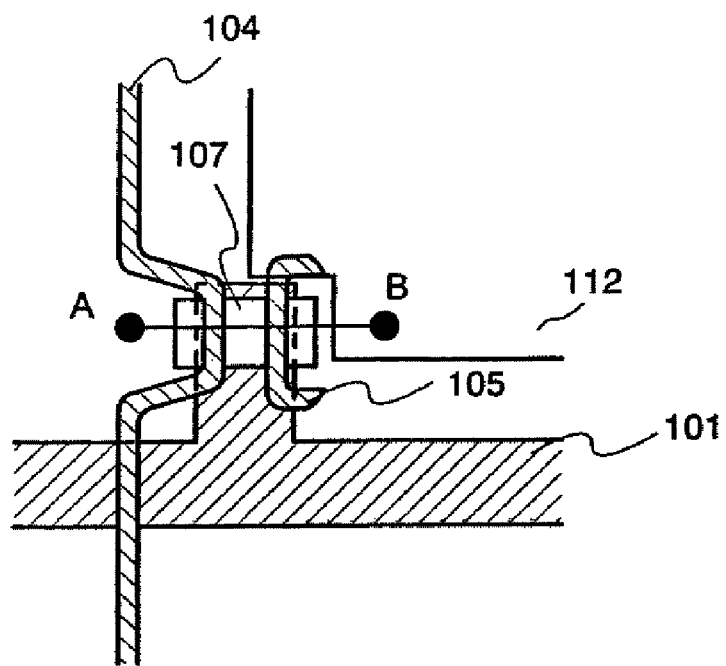
FIGS. 2A and 2B are a top view and a cross-sectional view showing one aspect of the present invention Embodiment Mode 1), respectively.
Figure 2B:
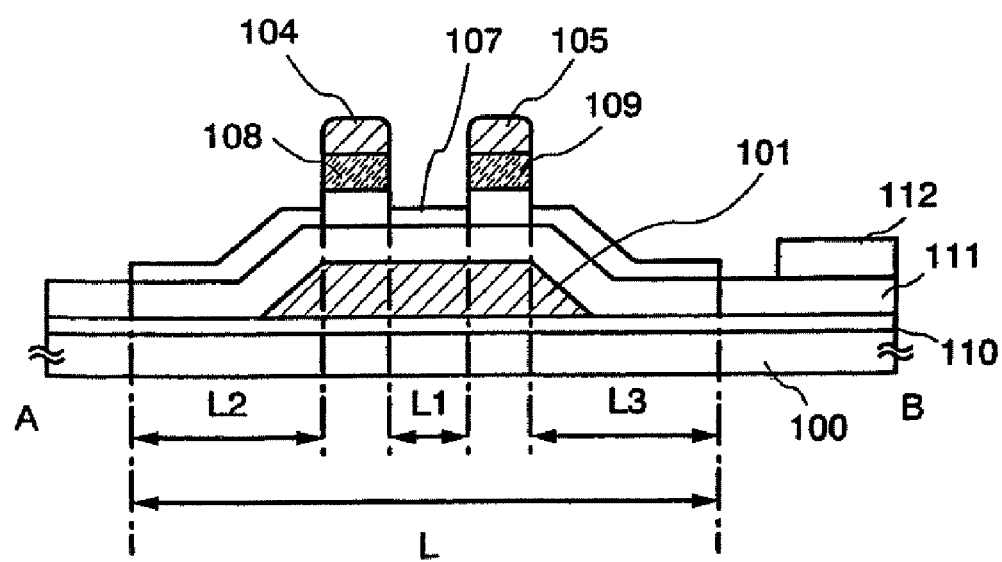

A top view when the electrode 112 is formed is shown in FIG. 2A. In addition, FIG. 2B shows a cross sectional view taken along the line A-B of FIG. 2A.

As described above, in this embodiment mode, the conductive film pattern formed by a droplet-discharging method is exposed to laser light, and developed, thereby realizing a microscopic pattern. By forming various patterns directly over the substrate by a droplet-discharging method, a display panel can be readily manufactured even if a fifth generation and later of a glass substrate having a side of over 1000 mm is used.

When the obtained TFT or the like is transferred to a flexible plastic film, a peeling layer (also referred to as a separation layer) is formed first over the substrate 100, a layer to be peeled for TFT or the like is formed. Then, the peeling layer is removed or broken, an element such as a TFT is separated from the substrate 100, and then, an adhesive layer is provided and the element is attached onto a plastic film. It should be noted that the step of peeling the layer to be peeled from the substrate is not especially limited, and a known method may be used. Above all, with the use of a peeling technique and a transferring technique described in Japanese Patent Application Laid-Open No. 2003-174153, a TFT having a high field effect mobility which can be obtained by a heat treatment of 500° C. or more over a glass substrate can be transferred to a plastic substrate with a good yield. The peeling technique and the transferring technique described in Japanese Patent Application Laid-Open No. 2003-174153 are a peeling method in which a metal layer is formed over a substrate, an oxide layer is stacked over the metal layer, at this time, a metal oxide layer is produced at the interface between the metal layer and the oxide layer, and peeling is performed in a later step with the use of the metal oxide layer.

Specifically, a tungsten film is formed by a sputtering method over a glass substrate, and a silicon oxide film is stacked by a sputtering method. A tungsten oxide layer in an amorphous state is formed when the silicon oxide film is formed by a sputtering method. Then, an element such as a TFT is formed over the silicon oxide film. The tungsten oxide layer is crystallized by performing a heat treatment of 400° C. or more in the element formation process. When physical force is added thereto, peeling occurs inside or at the interface of the tungsten oxide layer. The layer which has been peeled in this way (including an element such as a TFT) can be transferred to a plastic substrate.

In a case that the adhesion between layers is low when peeling is conducted, there is a risk that the portion with low adhesion is likely to be peeled and broken. After discharging droplets of a composition including a conductive material, selective laser irradiation is conducted. Thus, fusion of conductive particles is made in a short time, and the adhesion with the base film is increased. However, the metal wiring including a small amount of organic resin has a possibility of peeling defects in the peeling step. According to the present invention, miniaturization is done by removing a portion which is not irradiated with laser light, and forming an insulating film thereon to be in contact. Thus, the contact area between the insulating film and the base film is increased, thereby reducing the peeling defects which are likely to occur in the peeling step.

Embodiment Mode 2

An example of manufacturing an active matrix display device having a channel-stop type TFT as a switching element with reference to FIGS. 4A, 4B, 5A and 5B.

As in Embodiment Mode 1, a base insulating film 510 is formed over a substrate 500 having an insulating surface. A base film made of an insulating film such as silicon oxide, silicon nitride, silicon nitride oxide or silicon oxynitride is formed as the base insulating film 510. If it is not necessary, there is no particular need to form the base insulating film.

Thereafter, a conductive film having a thickness of 100 to 600 nm is formed by a sputtering method over the base insulating film 510. The conductive film may be formed with a single layer of an element selected from Ta, W, Ti, Mo, Al or Cu, or an alloy material or a compound material mainly containing such an element, or a stacked layer thereof. In addition, a semiconductor film typified by a polycrystalline silicon film doped with an impurity element such as phosphorus, may be used.

Subsequently, a resist mask is formed with a photomask, and etching is conducted by a dry etching method or a wet etching method. In this etching step, the conductive film is etched to form a gate electrode 501.

Thereafter, a gate insulating film 511 and a semiconductor film are sequentially formed by a plasma CVD method or a sputtering method. As the gate insulating film 511, a material mainly containing silicon oxide, silicon nitride, silicon nitride oxide or silicon oxynitride which is formed by a PCVD method, is used.

The semiconductor film is formed with an amorphous semiconductor film (a semiconductor film containing Si or Ge) which is manufactured by a vapor phase growth method, a sputtering method or a thermal CVD method using a semiconductor material gas typified by silane or germanium, or a semiconductor film mainly containing an organic material. As the semiconductor film mainly containing an organic material, a semiconductor film mainly containing a substance which includes a constant amount of carbon or allotropes of carbon (excluding diamond) and another element, can be used (such as a material showing a charge carrier mobility of at least $10^{-3}$ cm$^2$/V·s at a room temperature (20° C.), for example, a π-conjugated system aromatic amine compound, a chain compound, an organic pigment, an organic silicon compound or the like). Specifically, pentacene, tetracene, a thiophen oligomer derivative, a phenylene derivative, a phthalocyanine compound, a polyacetylene derivative, a polythiophene derivative, a cyanine dye, and the like, are given.

Then, an inorganic insulating film is formed by e.g., a plasma CVD method and formed into a desired shape in a desired region by a photolithography technique, to form channel protective films 514 and 515. In addition, it is also possible that a material solution including a photosensitive material, e.g., polyimide including a photosensitive material, polyvinyl alcohol including a photosensitive material or the like is dropped and selectively irradiated with laser light to remove a portion which is not irradiated, thereby forming a pattern, in forming the channel protective films 514 and 515.

Figure 4A:
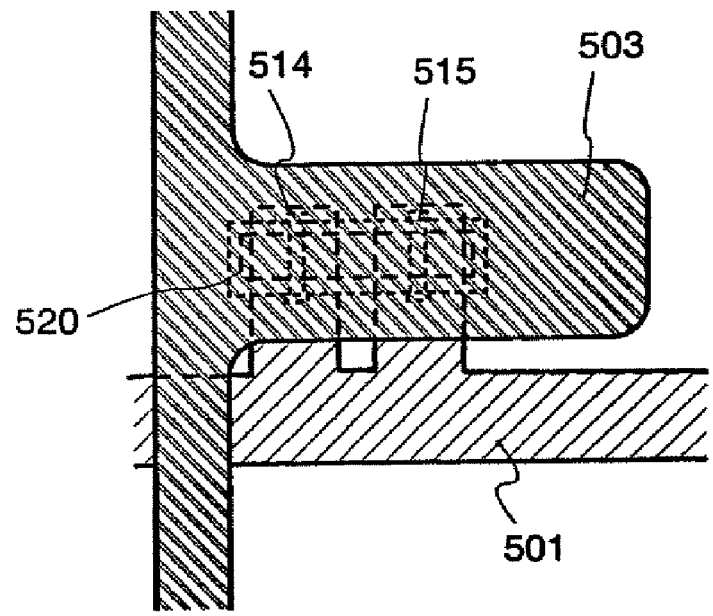
FIGS. 4A and 4B each show a top view showing one aspect of the present invention (Embodiment Mode 2)

Thereafter, the semiconductor film is formed into a desired pattern shape by a photolithography technique. Here, the pattern shape of the semiconductor film is formed into an island-like shape, and the dotted line in FIG. 4A shows the outline of the semiconductor film and the inside surrounded by the dotted line corresponds to the semiconductor film.

After that, a semiconductor film having one conductivity type, e.g., an n-type semiconductor film, is formed by a plasma CVD method or the like.

Then, the n-type semiconductor film is formed into a desired pattern by a photolithography technique.

Thereafter, a composition which includes a photosensitive material and a conductive material such as silver (Ag), gold (Au), copper (Cu), tungsten (W), or aluminum (Al) is selectively discharged by a droplet-discharging method to form a conductive film pattern 503. The conductive film pattern 503 is formed to cover the semiconductor film, the n-type semiconductor film and the channel protective films.

A top view at this time is shown in FIG. 4A. It should be noted that the present invention is not limited to the rectangular shape, and an oval shape, an L-like shape, or an irregular shape may be employed, although this embodiment mode describes the case where the semiconductor film has the rectangular shape.

Thereafter, laser irradiation is selectively conducted to expose a part of the conductive film pattern to laser light. Here, laser scanning is conducted so that laser light crosses the semiconductor film having the rectangular shape. Five crossing portions are formed on the semiconductor film by the laser scanning. Since a photosensitive material is pre-included in the material solution of a conductive film to be discharged, a chemical reaction occurs due to laser irradiation. Here, an example of using a negative type photosensitive material as the photosensitive material is shown, which allows the portion which is chemically reacted with laser light, to be left. An accurate pattern shape, in particular, a wiring with a thin width can be obtained by the laser irradiation.

Then, development is performed by using etchant (or developer) to remove excess portions, and baked to form a metal wiring serving as a source wiring 504 or a drain wiring 505.

Alternatively after a material solution of a conductive film is dropped and dried indoors or pre-baked, exposure by laser irradiation may be performed.

When the energy per area of laser light used for the light-exposure is made larger, it is possible that main baking becomes unnecessary. The manufacturing process can be shortened by reducing the step of main baking.

As a developer, an organic solvent, an alkali water solution (such as a metal alkali water solution or an organic alkali water solution) or the like can be used. In addition, water may be added into the organic solvent in such an extent that the dissolving power is not lost.

Figure 4B:
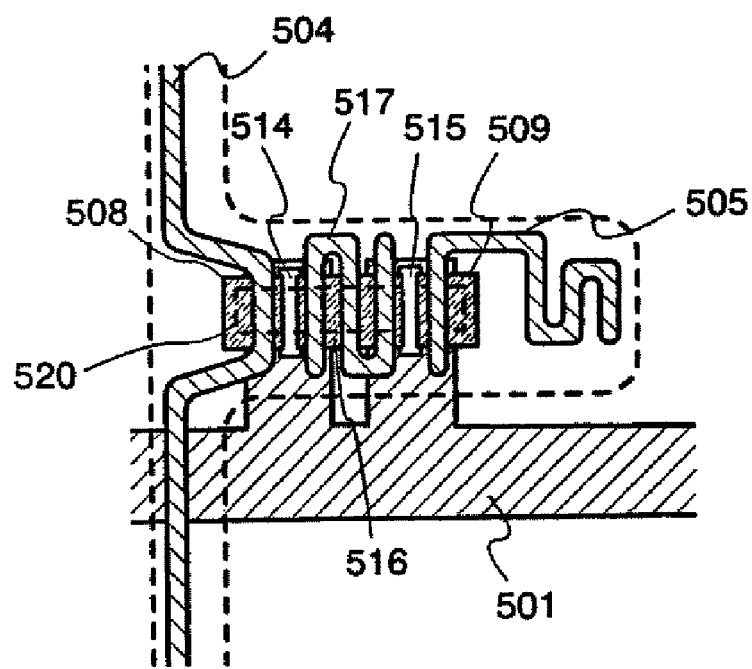

A top view at this time is shown in FIG. 4B. As shown in FIG. 4B, n-type semiconductor films 508, 509 and 516 which are not overlapped with the source wiring 504 or the drain wiring 505, are exposed. When the n-type semiconductor films 508, 509 and 516 are exposed in this manner, the adhesion between the exposed portion and an insulating film including silicon can be enhanced, in a case where an amorphous silicon film containing phosphorus is used as the n-type semiconductor film and the insulating film including silicon is stacked in a later step.

The TFT shown in FIG. 4B is a double gate TFT, in which the semiconductor layer is overlapped with gate electrodes in two portions and which has two channels. Channel protective films 514 and 515 are provided in the portions overlapping the channels. Between the two channels, an n-type semiconductor film 516 and a wiring pattern 517 to be formed over the n-type semiconductor film are provided. Here, in order to avoid contamination in a development process, the n-type semiconductor film and the channel protective films cover a semiconductor pattern 507 so that the semiconductor pattern 507 is protected.

Therefore, the length L between one end and the other end of the semiconductor film pattern 507 is a sum of the following lengths: the length of a region overlapping the drain wiring; the length between the region overlapping the drain wiring and one end of the semiconductor film: the length of a region overlapping the channel protective film 514; the length between the channel and the wiring pattern 517; the lengths of the portions overlapping the wiring pattern (three portions in sum); the lengths of the two regions between the three portions; the length between the wiring pattern 517 and the other channel; the length of the channel overlapping the channel protective film 515; the length of a region overlapping the source wiring; and the length between the region overlapping the source wiring and the other end of the semiconductor film.

Then, an interlayer insulating film 513 made of an inorganic insulting film or an organic insulating film is formed. A material mainly containing silicon oxide, silicon nitride, silicon nitride oxide or silicon oxynitride is formed by a PCVD method, is used as the interlayer insulating film 513. In addition, as other materials for the interlayer insulating film 513, an organic resin whose surface is planarized by a coating method (resin materials such as epoxy resin, acryl resin, phenol resin, novolac resign, melamine resin, and urethane resin) may be used. Further, as another example of materials for the interlayer insulating film 513, a $SiO_x$ film including an alkyl group formed with siloxane-based polymer may be employed.

A contact hole 520 reaching the drain wiring 505 is formed in the interlayer insulating film, and an electrode 512 overlapping the contact hole is formed. In this embodiment mode, the drain wiring 505 in the area where the contact hole 520 is to be formed is made meandering (zigzag) to form concavities and convexities, thereby improving the adhesion. In addition, the wiring pattern 517 is also made meandering as well as the drain wiring to form one stroke shape, and thus, laser scanning can be easily conducted for light-exposure. By making the wiring pattern to have one stroke shape, laser scanning can be conducted smoothly.

As the electrode 512, indium tin oxide (ITO), indium tin oxide including silicon oxide (ITSO), zinc oxide (ZnO), tin oxide ($SnO_2$) or the like may be used to form a desired pattern. Further, a metal such as silver (Ag), gold (Au), copper (Cu), tungsten (W), or aluminum (Al) may be used. The electrode 512 has a structure in which it is contact with the gate insulating film 511. Even if the adhesion between the electrode 512 and the drain wiring 505 is not so high, it is acceptable as long as the adhesion between the electrode 512 and the gate insulating film 511 is high.

Figure 5A:
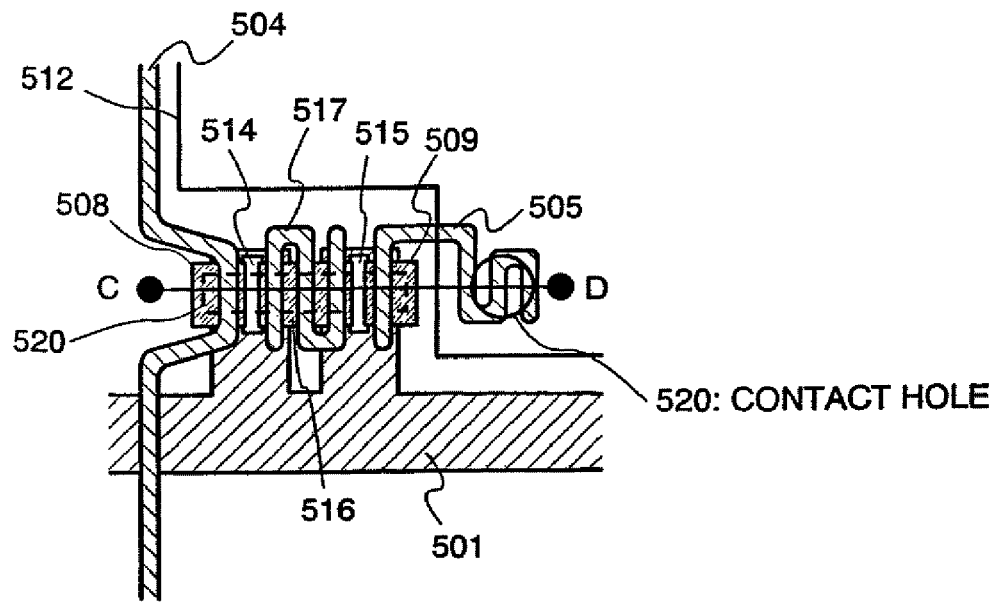
FIGS. 5A and 5B are a top view and a cross-sectional view showing one aspect of the present invention (Embodiment Mode 2), respectively.
Figure 5B:
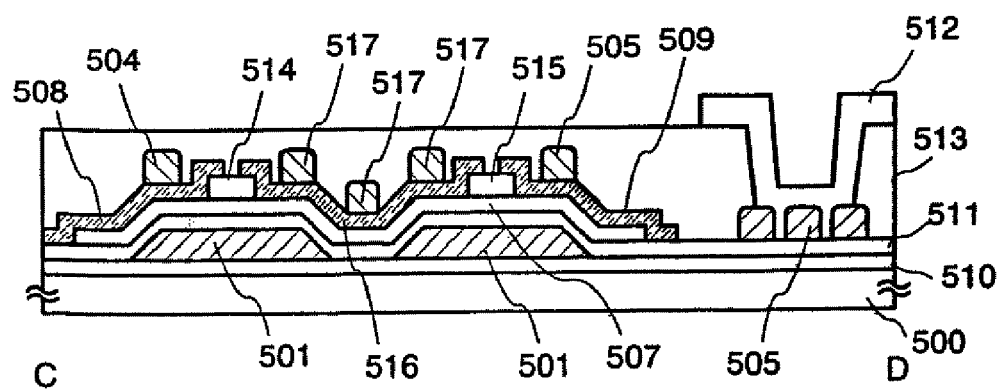

A top view of a part of one pixel in the case of using the electrode 512 as a pixel electrode is shown in FIG. 5A. FIG. 5B is a cross-sectional view taken along the line C-D of FIG. 5A.

The electrode 512 may be used as a connection electrode or a conductive pattern serving as an antenna, without being limited to a pixel electrode or an electrode of a light-emitting element (cathode or anode).

As described above, in this embodiment mode, the conductive pattern formed by a droplet-discharging method is exposed to laser light and developed to form a microscopic pattern. Specifically, since the source wiring can be miniaturized, the aperture ratio of a liquid crystal display device can be increased.

When the obtained TFT or the like is transferred to a flexible plastic film, it is also possible that a peeling layer (also referred to as a separation layer) is formed first over the substrate 500, and a layer to be separated for TFT or the like is formed. Then, the separation layer is removed or broken, an element such as a TFT is separated from the substrate 500, and an adhesive layer is provided and the element is attached onto a plastic film.

This embodiment mode can be freely combined with Embodiment Mode 1.

The present invention having the above structure will be described in detail in the following Examples.

EXAMPLE 1

An active matrix type liquid crystal display device can be manufactured using a TFT shown in Embodiment Mode 1 or Embodiment Mode 2 as a switching element.

Figure 6:
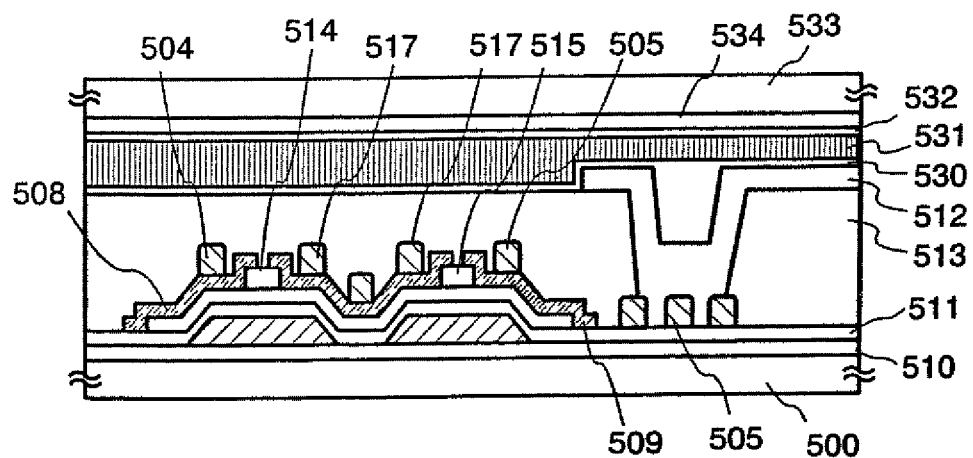
FIG. 6 is one example of a cross-section of a liquid crystal display device (Example 1)

A manufacturing method of an active matrix liquid crystal display device using a TFT shown in Embodiment Mode 2 as a switching element is shown hereinafter. FIG. 6 shows an example of an active matrix liquid crystal display device. Note that similar portions in FIG. 6 to those in Embodiment Mode 2 are represented by the same reference numerals as those in Embodiment Mode 2.

An insulating film 513 is formed after forming the source wiring 504 and the drain wiring 505. A contact hole is formed in the insulating film 513 and an electrode 512 serving as a pixel electrode is formed. A transparent conductive film is used for the electrode 512.

Then, an orientation film 530 is formed to cover the electrode 512. A droplet-discharging method, a screen printing method or an offset printing method may be adopted to form the orientation film 530. After that, a rubbing treatment is conducted to the surface of the orientation film 530.

Then, a counter substrate 533 is provided with a counter electrode 534 made of a transparent electrode and an orientation film 532 formed thereover. A sealant (not shown in the figure) with a closed pattern is then formed by a droplet-discharging method so as to surround a region overlapped with a pixel portion. Here, an example in which a sealant with a closed pattern is drawn, is shown, since a liquid crystal is dropped in a later step. However, a dipping method by which a liquid crystal is injected with capillary phenomenon may be used after providing a seal pattern having an opening and attaching the TFT substrate thereto.

Next, a liquid crystal is dropped under reduced pressure so as to prevent bubbles from entering, and the both substrates are attached to each other. A liquid crystal is dropped once or plural times in the closed-loop seal pattern. A twisted nematic (TN) mode is used as an orientation mode of a liquid crystal in many cases. In this TN mode, the orientation direction of liquid crystal molecules is twisted at 90° C. with respect to the polarization of light from its entrance to the exit. In a case of manufacturing a TN liquid crystal display device, the substrates are pasted together so that the rubbing directions are orthogonalized.

The spacing between the pair of substrates may be maintained by spraying a spherical spacer, forming a columnar spacer made of resin, or mixing a filler into the sealant. The above-mentioned columnar spacer is formed of an organic resin material mainly containing at least one material selected from acrylic, polyimide, polyimideamide, and epoxy; any one material of silicon oxide, silicon nitride, silicon nitride oxide and silicon oxynitride; or an inorganic material of a stacked film of these materials.

Next, an unnecessary substrate is sectioned. In a case of obtaining a plurality of panels from one substrate, each panel is separated off. In a case of obtaining one panel from one substrate, the sectioning step can be skipped by pasting a counter substrate which is cut in advance.

An FPC is pasted through an anisotropic conductive layer by a known method. A liquid crystal module shown in FIG. 6 is completed through the above steps. Further, an optical film such as a color filter is attached as necessary. In a case of a transmissive liquid crystal display device, polarization plates are attached to both the active matrix substrate and the counter substrate.

A conductive film pattern is formed by a droplet-discharging method, and selectively irradiated with laser light. Thus, a more miniaturized source wiring or drain wiring than the conductive pattern itself just after discharging, can be formed. According to the present invention, reduction of the number of steps and saving of materials are possible and cost reduction as a result thereof is also possible.

Example 1 can be freely combined with Embodiment Mode 1 or Embodiment Mode 2.

EXAMPLE 2

An active matrix type light-emitting display device can be manufactured using a TFT shown in Embodiment Mode 1 or Embodiment Mode 2.

Figure 7:
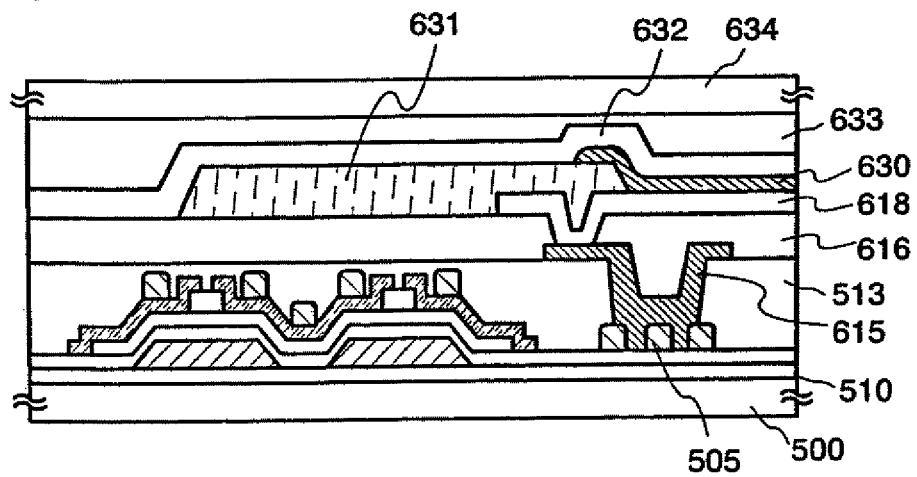
FIG. 7 is one example of a cross-section of a light-emitting device (Example 2)

A manufacturing method of an active matrix light-emitting display device using a TFT shown in Embodiment Mode 2 as a switching element is shown hereinafter. Here, a case where the TFT is an n-channel TFT is described as one example. FIG. 7 shows an example of an active matrix light-emitting display device. Note that similar portions in FIG. 7 to those in Embodiment Mode 2 are represented by the same reference numerals as those in Embodiment Mode 2.

An insulating film 513 is formed after forming the source wiring 504 and the drain wiring 505. A contact hole is formed in the insulating film 513 and an electrode 615 serving as a connection electrode is formed. A metal conductive film formed by a sputtering method is used for the electrode 615.

Then, an insulating film 616 having planarity is formed. A contact hole is formed in the insulating film 616 having planarity and a first electrode 618 is formed.

The first electrode 618 preferably serves as a cathode. To reflect light by the first electrode, a desired pattern made from a composition mainly containing metal particles such as silver (Ag), gold (Au), copper (Cu), tungsten (W), or aluminum (Al) is formed to form the first electrode 618.

Then, a partition 631 covering a periphery portion of the first electrode 618 is formed. The partition (also referred to as a bank) 631 is formed by using a material containing, silicon, an organic material or a compound material. In addition, a porous film may be used. It is preferable that a photosensitive or non-photosensitive material such as acryl or polyimide is used, since the radius of curvature of the side surface is serially varies without any break in a thin film in an upper layer.

Subsequently, a layer functioning as an electroluminescent layer, namely, a layer containing an organic compound 630 is formed. The layer containing an organic compound 630 has a stacked structure, and each layer is formed by using an evaporation method or a coating method. For example, an electron transporting layer (an electron injecting layer), a light-emitting layer, a hole-transporting layer, a hole-injecting layer are sequentially formed over a cathode.

Note that a plasma treatment in oxygen atmosphere or a heat treatment in vacuum atmosphere is preferably carried out before forming the layer containing an organic compound 630. In a case of using an evaporation method, an organic compound is vaporized beforehand by resistance heating, and it is scattered toward the substrate when a shutter is opened to deposit it. The vaporized organic compound is scattered upwardly to be evaporated on the substrate through an opening provided in a metal mask. In addition, a mask for each luminous color (R, G and B) may be aligned to achieve full-color.

Instead of forming R, G and B, separately, a material emitting a single color is used as the layer containing an organic compound 630, and a color filter or a color conversion layer can be combined to achieve full-color display.

Subsequently, the second electrode 632 is formed. The second electrode 632 functioning as an anode of a light-emitting element is formed using a transparent conductive film which transmits light. For example, besides ITO or ITSO, a transparent conductive film in which zinc oxide (ZnO) of 2 to 20% is mixed in indium oxide is used. A light-emitting element has a structure in which the layer containing an organic compound 630 is interposed between the first electrode and the second electrode. In addition, materials of the first and second electrodes are required to be selected in consideration of the work function. Both the first and second electrodes may be an anode or a cathode depending on a pixel structure.

In addition, a protective layer protecting the second electrode 632 may be formed.

Subsequently, the sealing substrate 634 is pasted with a sealant (not shown in the figure) to seal the light-emitting element. A region surrounded with the sealant is filled with a transparent filler 633. As the filler 633, it is not especially limited as long as it has a light-transmitting property, and an ultraviolet curing or heat curing epoxy resin may be typically used.

The FPC is attached to a terminal electrode with an anisotropic conductive film last.

Through the above steps, an active matrix light-emitting device as shown in FIG. 7 is manufactured. Thus, a more miniaturized source wiring or drain wiring than the conductive pattern itself just after discharging, can be formed by forming a pattern of a conductive film by a droplet-discharging method and selectively irradiating the pattern with laser light. According to the present invention, reduction of the number of steps and saving of materials are possible and cost reduction as a result thereof is also possible.

Example 2 can be freely combined with Embodiment Mode 1 or Embodiment Mode 2.

EXAMPLE 3

A wireless chip (also referred to as a wireless processor, a wireless memory, or a wireless tag) can also be formed using a TFT shown in Embodiment Mode 1 or Embodiment Mode 2.

Figure 8:
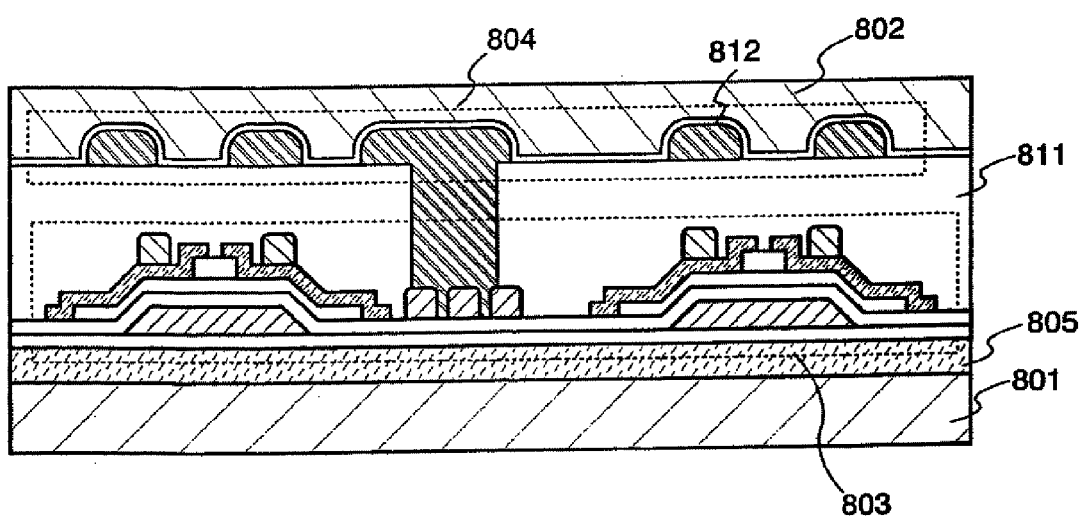
FIG. 8 is one example of a cross-section showing a structure of the present invention (Example 3)
Figure 9A:
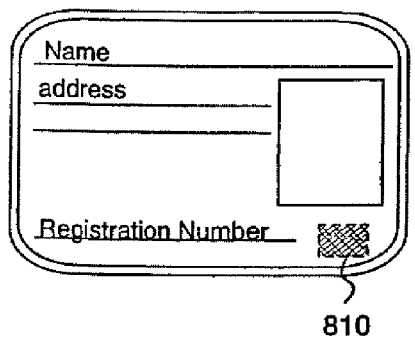
FIGS. 9A to 9F each are an external view describing an example of a semiconductor device (Example 3)
Figure 9B:
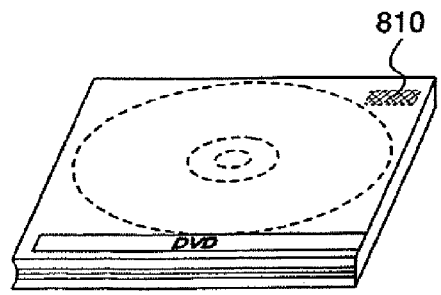
Figure 9C:
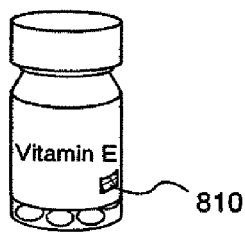
Figure 9D:
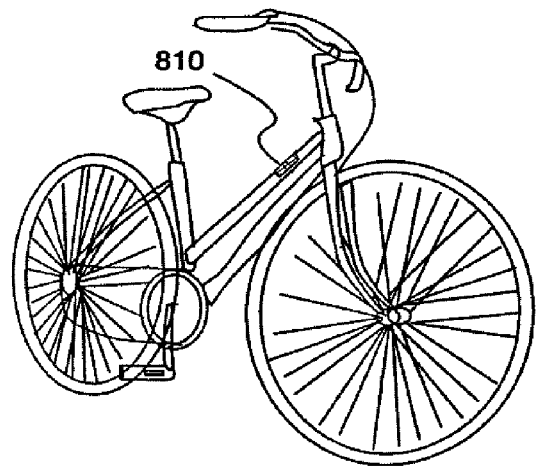
Figure 9E:
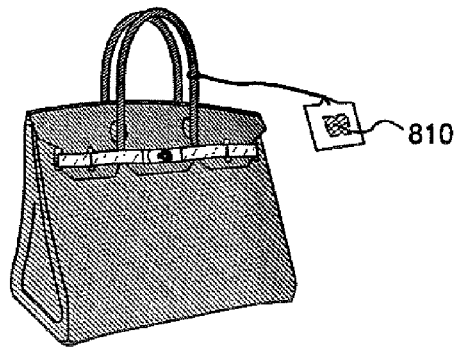
Figure 9F:
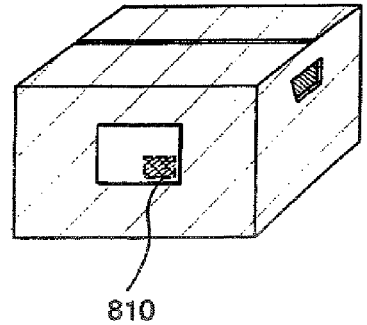

A structure of a wireless chip which can be formed according to the present invention is described with reference to FIG. 8. A wireless chip is constituted by a thin film integrated circuit 803 and an antenna 804 connected thereto. The thin film integrated circuit and the antenna are sandwiched between cover materials 801 and 802. The thin film integrated circuit 803 may be attached to the cover materials with an adhesive. In FIG. 8, one surface of the thin film integrated circuit 803 is attached to the cover material 801 with an adhesive 805.

The thin film integrated circuit 803 is formed using a TFT shown in Embodiment Mode 1 or 2, then peeled off by a known peeling process and attached to a cover material. The semiconductor element used for the thin film integrated circuit 803 is not limited to this, and in addition to the TFT, a memory element, a diode, a photoelectric conversion element, a resistor element, a coil, a capacitor element an inductor and the like, can also be used.

As shown in FIG. 8, an interlayer insulating film 811 is formed over the IT of the thin film integrated circuit 803, and the antenna 804 is connected to the TFT through the interlayer insulating film 811. Further, a barrier film 812 made of silicon nitride or the like is formed over the interlayer insulating film 811 and the antenna 804.

A conductive pattern is formed by discharging droplets containing a photosensitive material and a conductor such as gold, silver or copper by a droplet-discharging method, and selectively irradiated with laser light to form a pattern for the antenna 804. In this way, the antenna 804 is formed. A portion of the conductive film pattern which is not irradiated with laser light is removed. When the antenna is formed by a droplet-discharging method, reduction in the number of steps and saving of materials can be achieved, leading to cost reduction.

For each of the cover materials 801 and 802, a film (made of polypropylene, polyester, vinyl, polyvinyl fluoride, vinyl chloride, or the like); paper of a fibrous material; a stacked film where a base film (polyester, polyamide, an inorganic vapor deposition film, papers, or the like) and an adhesive synthetic resin film (an acrylic based synthetic resin, an epoxy based synthetic resin, or the like) are stacked; or the like; is preferably used. The film is attached to a subject by thermocompression. In the thermocompression, an adhesive layer provided in the outmost surface of the film or a layer (not an adhesive layer) formed as the outermost layer is melted by a heat treatment and is attached by applying pressure.

In a case that the cover material uses a flammable pollution-free material such as paper, fiber and carbon graphite, the used wireless chip can be burned or cut out. The wireless chip using such a material is pollution free, since it does not generate a poisonous gas even if being burned.

Although the wireless chip is attached to the cover material 801 with the adhesive 805 in FIG. 8, the wireless chip may be attached to an object instead of the cover material 801.

The application range of such wireless chips is so wide. FIG. 9 shows examples about the applications of wireless chips. Wireless chips may be mounted on various objects, for example, such as bills, coins, securities, bearer bonds, certificates (licenses, resident cards and the like, see FIG. 9A), containers for wrapping objects (wrapping papers, bottles and the like, see FIG. 9C), recording media (DVD software, video tapes and the like, see FIG. 9B), vehicles (bicycles and the like, see FIG. 9D), belongings (bags, glasses and the like), foods, plants, animals, human body, clothes, livingware, and electronic devices, or shipping tags of objects (see FIGS. 9E and 9F). The electronic devices include liquid crystal display devices, EL display devices, television sets (also simply called TV, televisions or television receivers), cellular phones, and the like.

A wireless chip 810 is attached to the surface of an object or incorporated in an object such that the wireless chip 810 is fixed to the object. For example, a wireless chip may be incorporated in a paper of a book, or an organic resin of a package. When a wireless chip is incorporated in bills, coins, securities, bearer bonds, certificates, or the like, forgery can be prevented. In addition, when a wireless chip is incorporated in containers for wrapping objects, recording media, belongings, foods, clothes, livingware, electronic devices, or the like, more efficient test systems, rental systems or the like can be provided. A wireless chip which can be formed according to the present invention is obtained in such a manner that, after a thin film integrated circuit formed over a substrate is peeled off by a known peeling process, it is provided for a cover material; therefore, the wireless chip can be reduced in size, thickness and weight, and can be mounted on an object without spoiling a design of the object. In addition, since such a wireless chip has flexibility, it can be used for an object having a curved surface, such as bottles and pipes.

When a wireless chip which can be formed according to the present invention is applied to product management and distribution system, a sophisticated system can be achieved. For example, when information stored in a wireless chip mounted on a shipping tag is read by a reader/writer provided beside a conveyor belt, information such as distribution process and delivery address is read out to easily inspect an article and distribute packages.

Example 3 can be freely combined with Embodiment Mode 1 or Embodiment Mode 2.

EXAMPLE 4

As semiconductor devices and electronic devices according to the present invention, cameras such as video cameras or digital cameras, goggle-type displays (head mounted displays), navigation systems, audio reproduction devices (such as car audio compositions, or audio compositions), personal computers, game machines, mobile information terminals (mobile computers, cellular phones, mobile game machines, electronic books, and the like), image reproduction devices equipped with a recording medium (specifically, devices which can reproduce content of a recording medium such as Digital Versatile Disk (DVD) and have a display for displaying the image), and the like are given. Specific examples of the electronic devices are shown in FIGS. 10A to 10D and FIG. 11.

Figure 10A:
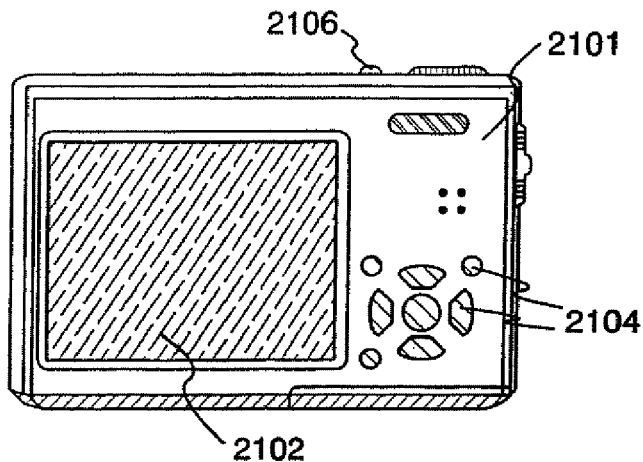
FIGS. 10A to 10D each show an example of electronic devices (Example 4)

FIG. 10A shows a digital camera, which includes a main body 2102, a display portion 2102, an imaging portion, operation keys 2104, a shutter 2106 and the like. FIG. 10A shows the digital camera seen from the display portion 2102 side, and the imaging portion is not shown in FIG. 10A. According to the present invention, a digital camera can be manufactured in a process with reduced manufacturing cost.

Figure 10B:
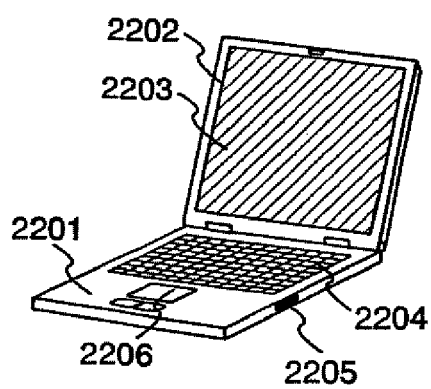

FIG. 10B shows a lap top personal computer including a main body 2201, a casing 2202, a display portion 2203, a keyboard 2204, an external connection port 2205, a pointing mouse 2206, and the like. According to the present invention, a lap top personal compute can be manufactured in a process with reduced manufacturing cost.

Figure 10C:
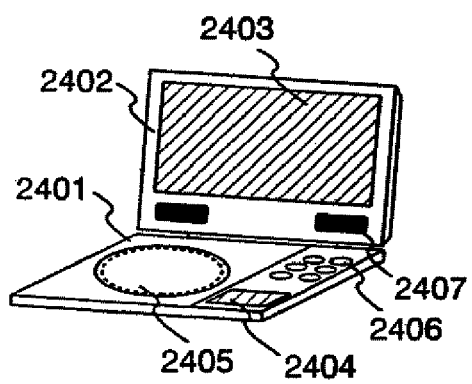

FIG. 10C shows a portable image reproducing device provided with a recording medium (specifically a DVD player), which includes a main body 2401, a casing 2402, a display portion A 2403, a display portion B 2404, a recording medium (such as a DVD) reading portion 2405, operation keys 2406, a speaker portion 2407 and the like. The display portion A 2403 mainly displays image information and the display portion B 2404 mainly displays character information. The category of such an image reproducing device provided with a recording medium includes a home game machine and the like. According to the present invention, an image reproducing device can be manufactured in a process with reduced manufacturing cost.

Figure 10D:
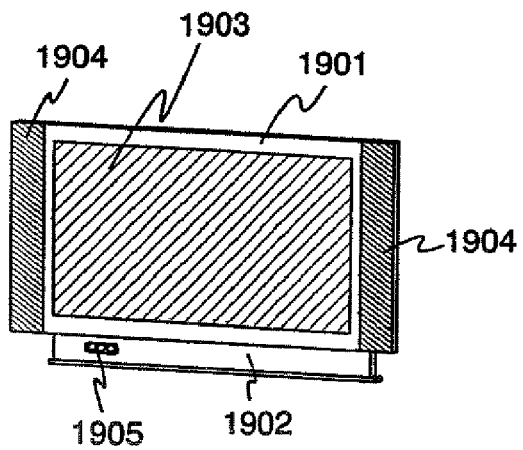

FIG. 10D shows a display device which includes a casing 1901, a support 1902, a display portion 1903, a speaker portion 1904, a video input terminal 1905 and the like. This display device is manufactured by using a thin film transistor formed by a manufacturing method described in Embodiment Modes described above for the display portion 1903 and a driver circuit. Liquid crystal display devices, light-emitting devices and the like are given as examples of display devices, specifically, all types of display devices for displaying information are included, for example, display devices for computers, display devices for receiving television broadcasting, and display devices for advertisement. According to the present invention, a display device, in particular, a large size display device having a large screen of 22 to 50 inches, can be manufactured in a process with reduced manufacturing cost.

Figure 11:
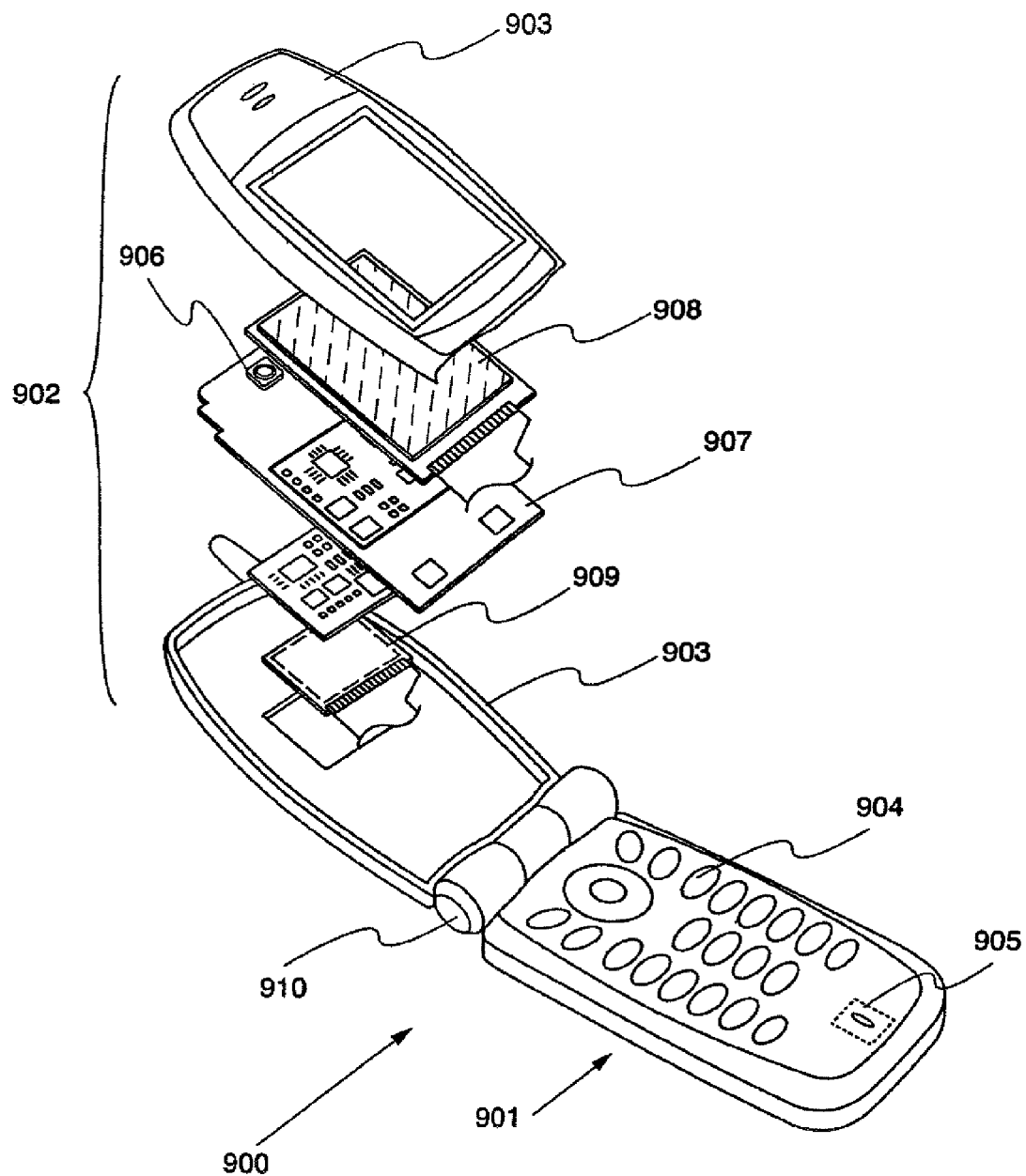
FIG. 11 shows an example of an electronic device (Example 4).

In the cellular phone 900 shown in FIG. 11, a main body (A) 901 including operation switches 904, a microphone 905, and the like is connected with a hinge 910 to a main body (B) 902 including a display panel (A) 908, a display panel (B) 909, a loudspeaker 906, and the like, and it is openable and closable by the hinge 910. The display panel (A) 908 and the display panel (B) 909 are placed in a casing 903 of the main body (B) 902 together with a circuit board 907. Pixel portions of the display panel (A) 908 and the display panel (B) 909 are placed such that they are visible through an opening formed in the casing 903.

As to the display panel (A) 908 and the display panel (B) 909, the specification such as the number of pixels can be appropriately determined in accordance with functions of the cellular phone 900. For example, the display panel (A) 908 and the display panel (B) 909 can be combined as a main screen and a sub-screen, respectively.

The display panel (A) 908 includes a TFT shown in Examples 1 to 3 as a transistor of a pixel. According to the present invention, a mobile information terminal can be manufactured in a process with reduced manufacturing cost.

The cellular phone according to Example 4 can be changed in various modes depending on functions or applications thereof. For example, it may be a camera-equipped cellular phone by implementing an imaging element in the hinge 910. Even when the operation switches 904, the display panel (A) 908, and the display panel (B) 909 are placed in one casing, so that all devices are set inside the casing, the above-described effect can be obtained. Further, a similar effect can be obtained even when the structure of Example 4 is applied to an information display terminal provided with a plurality of display portions.

As described above, various types of electronic devices can be completed by using a manufacturing method or a structure for implementing the present invention, in other words, any one manufacturing method or structure of Embodiment Modes 1 and 2 and Examples 1 to 3.

According to the present invention, in a manufacturing process of a display device including a step of forming a conductive pattern, a light-exposure step or a development step can be reduced, and reduction of the amount of used materials can achieved. Therefore, a dramatically cost reduction can be realized regardless of a substrate size.

The present application is based on Japanese Patent Application serial No. 2005-027312 filed on Feb. 3, 2005 in Japanese Patent Office, the entire contents of which are hereby incorporated by reference.

What is claimed is:

1. An active matrix liquid crystal display device comprising:
a thin film transistor formed over a substrate, the thin film transistor comprising:
a gate electrode;
a gate insulating film formed over the gate electrode; and
a semiconductor film comprising a metal oxide wherein the metal oxide is In—Ga—Zn—O;
a first inorganic insulating film formed on the semiconductor film;
a second insulating film formed over the first inorganic insulating film; and
a pixel electrode formed on the second insulating film and electrically connected to the thin film transistor,
wherein the second insulating film is formed from a material solution.

2. An active matrix EL display device comprising:
a thin film transistor formed over a substrate, the thin film transistor comprising:
a gate electrode;
a gate insulating film formed over the gate electrode; and
a semiconductor film comprising a metal oxide wherein the metal oxide is In—Ga—Zn—O;
a first inorganic insulating film formed on the semiconductor film;
a second insulating film formed over the first inorganic insulating film;
a pixel electrode formed on the second insulating film and electrically connected to the thin film transistor;
wherein the second insulating film is formed from a material solution.

3. An active matrix liquid crystal display device comprising:
a thin film transistor formed over a substrate, the thin film transistor comprising:
a gate electrode;
a gate insulating film formed over the gate electrode; and
a semiconductor film comprising a metal oxide wherein the metal oxide is In—Ga—Zn—O;
a first inorganic insulating film formed on the semiconductor film;
a second insulating film having a planarized upper surface formed over the first inorganic insulating film; and
a pixel electrode formed over the second insulating film and electrically connected to the thin film transistor.

4. The active matrix liquid crystal display device according to claim 3, wherein the second insulating film comprises an organic resin.

5. The active matrix liquid crystal display device according to claim 3, wherein the second insulating film comprises a siloxane-based polymer.

6. An active matrix EL display device comprising:
a thin film transistor formed over a substrate, the thin film transistor comprising:
a gate electrode;
a gate insulating film formed over the gate electrode; and a semiconductor film comprising a metal oxide wherein the metal oxide is In—Ga—Zn—O;
a first inorganic insulating film formed on the semiconductor film;
a second insulating film having a planarized upper surface formed over the first inorganic insulating film; and
a pixel electrode formed over the second insulating film and electrically connected to the thin film transistor.

7. The active matrix EL display device according to claim 6, wherein the second insulating film comprises an organic resin.

8. The active matrix EL display device according to claim 6, wherein the second insulating film comprises a siloxane-based polymer.

* * * * *